(12) United States Patent
Zhang et al.

(10) Patent No.: US 9,894,752 B2
(45) Date of Patent: Feb. 13, 2018

(54) INDUCTORS FOR CIRCUIT BOARD THROUGH HOLE STRUCTURES

(71) Applicant: Intel Corporation, Santa Clara, CA (US)

(72) Inventors: Zhichao Zhang, Chandler, AZ (US); Gong Ouyang, Olympia, WA (US); Kai Xiao, University Place, WA (US); Kemal Aygun, Chandler, AZ (US); Beom-Taek Lee, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 276 days.

(21) Appl. No.: 14/678,714

(22) Filed: Apr. 3, 2015

(65) Prior Publication Data

US 2016/0276092 A1 Sep. 22, 2016

Related U.S. Application Data

(63) Continuation-in-part of application No. 14/664,827, filed on Mar. 21, 2015.

(51) Int. Cl.
*H01F 27/28* (2006.01)
*H01F 41/04* (2006.01)
*H05K 1/02* (2006.01)
*H05K 1/16* (2006.01)
*H01F 17/00* (2006.01)
*H05K 1/11* (2006.01)

(52) U.S. Cl.
CPC ....... *H05K 1/0237* (2013.01); *H01F 17/0013* (2013.01); *H05K 1/0233* (2013.01); *H01F 2017/002* (2013.01); *H05K 1/116* (2013.01); *H05K 1/165* (2013.01)

(58) Field of Classification Search
CPC .............. H01F 27/2804; H01F 41/041; H01F 2027/2809; H05K 1/0233; H05K 1/0251; H05K 1/0243; H05K 1/165
USPC ....................................................... 361/781
See application file for complete search history.

(56) References Cited

U.S. PATENT DOCUMENTS

| 8,692,595 | B1 | 4/2014 | Mendel et al. |
| 2005/0219011 | A1* | 10/2005 | Lin ...................... H03H 7/0123 333/185 |
| 2012/0008727 | A1 | 1/2012 | Mohajeri et al. |
| 2014/0306793 | A1* | 10/2014 | Shamim .............. H01F 17/0006 336/200 |

OTHER PUBLICATIONS

Office Action for U.S. Appl. No. 14/664,827, dated Apr. 7, 2017, 18 pages.

* cited by examiner

*Primary Examiner* — Jenny L Wagner
*Assistant Examiner* — Michael P McFadden
(74) *Attorney, Agent, or Firm* — Jordan IP Law, LLC

(57) ABSTRACT

Systems, apparatuses, and methods may include a circuit board having a plated through hole with a via portion and a stub portion and a self-coupled inductor electrically coupled to the via portion of the plated through hole. The self-coupled inductor may include a first inductor mutually coupled to a second inductor in series to reduce a capacitive effect of the stub portion of the plated through hole.

12 Claims, 7 Drawing Sheets

INDUCTORS FOR CIRCUIT BOARD THROUGH HOLE STRUCTURES

CROSS-REFERENCE TO RELATED APPLICATIONS

The present application is a continuation-in-part of U.S. patent application Ser. No. 14/664,827 filed Mar. 21, 2015.

TECHNICAL FIELD

Embodiments generally relate to circuit boards. More particularly, embodiments relate to inductors for plated through holes on circuit boards.

BACKGROUND

Circuit boards such as printed circuit boards (PCBs) typically include plated through holes as interconnect structures to electrically couple components. A conventional through hole may traverse an entire cross-section of a circuit board, wherein electrical traces extending from a via portion of the through hole may act as an electrical path to electrically couple components on the PCB. In some cases, the intended signaling portion of a via may cover less than the entire length of the through hole, wherein the remaining unintended signaling portion of the through hole may be considered a stub portion. A related art plated through hole is shown in FIG. 1. A via portion 4 is shown between electrical traces 6 and 8 while a stub portion 9 extends below electrical trace 8. Electrical traces may interconnect a transition between a surface layer and an internal layer or between two internal layers; the closer the internal routing layer is to the surface layer, the longer the stub portion will be.

The impedance of the stub portion may be approximated by that of a transmission line with an open termination:

$$Z_{OC} = -jZ_0 \cot(\beta l)$$

where j is an imaginary number, $Z_0$ is a characteristic impedance of the system, $\beta$ is a propagation constant, and l is the stub length.

For a frequency in the GHz range and a stub length in the millimeter range, the impedance will maintain a negative imaginary value, which is equivalent to a capacitance in shunt with a primary electrical interconnect. This condition may be represented as an equivalent circuit that includes a channel and a capacitance representing a stub portion. The stub portion significantly changes the impedance profile of the through hole, causing severe reflections, resonance, and additional loss. Consequently, the structure is not useful for high speed links. To reduce these effects, the stub may be removed through drilling. However, stub removal may add cost and decrease the mechanical integrity of the circuit board. Micro-via and/or buried via technologies may be used to remove the stub as well. However, these technologies may add significant cost to manufacturing the circuit board.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
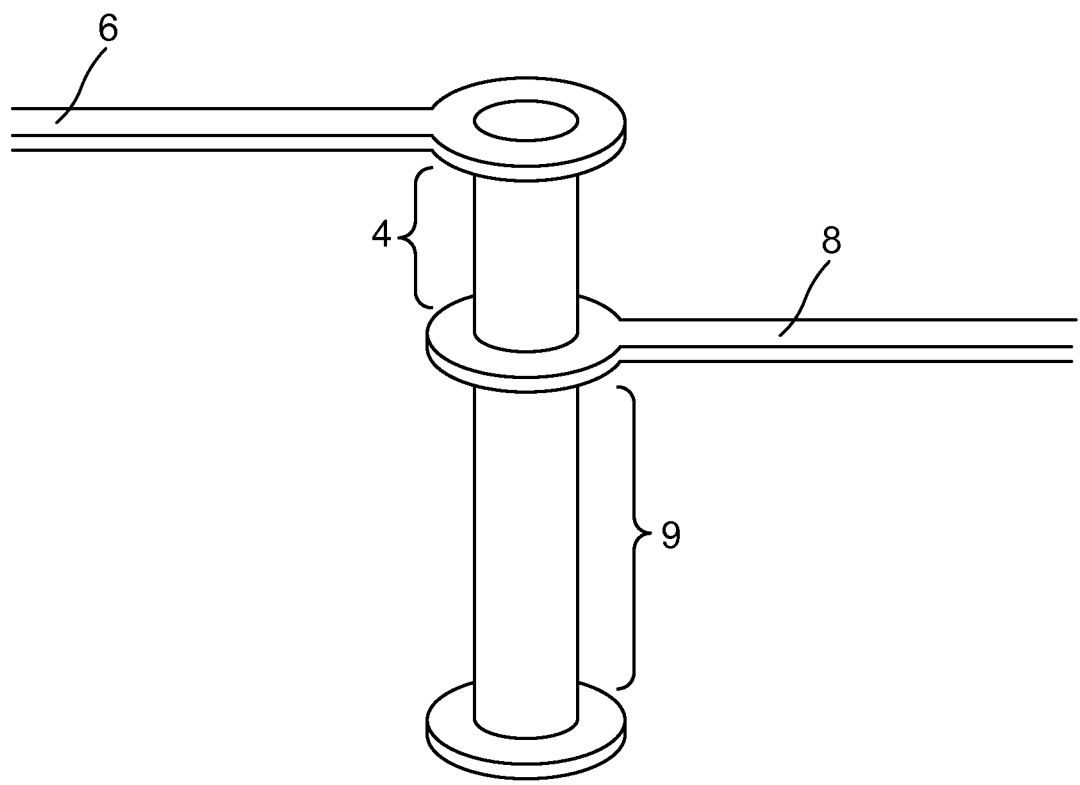
FIG. 1 is a related art plated through hole.
Figure 2:
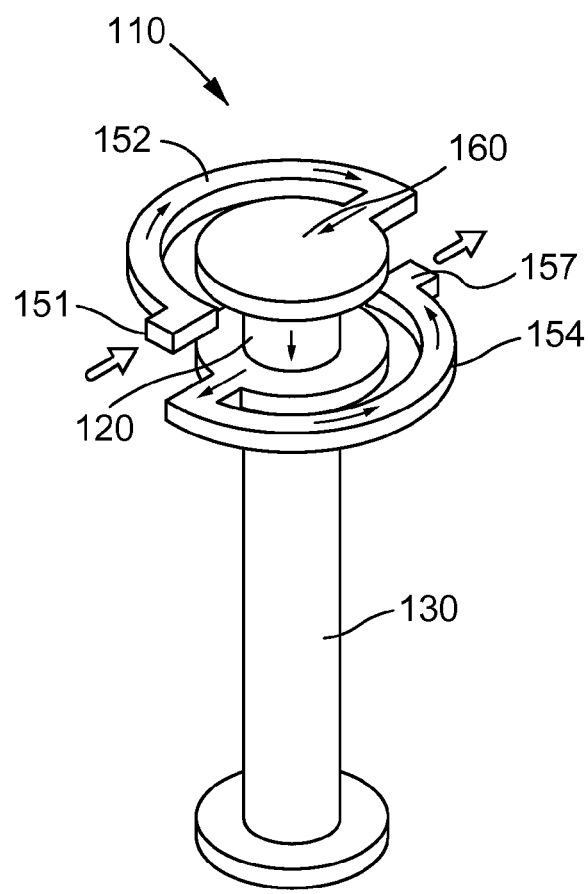
FIG. 2 is a perspective view of an example of the self-coupled inductor for a plated through hole according to an embodiment.

In order to compensate for stub capacitance of a plated through hole, a self-coupled inductor may be used. As used herein, the expression "self-coupled inductor" relates to plural, mutually-coupled inductors. An individual inductor is represented by the term "inductor." FIG. 2 depicts a plated through hole 110 according to an embodiment. The plated through hole 110 includes a via portion 120, a stub portion 130, and a self-coupled inductor formed by first and second inductor paths 152 and 154. Usually, the plated through hole 110 may be capped with a conductor cap 160 (e.g., pad) in the layer where path traces are connected to the plated through hole as shown in FIG. 2. In FIG. 2, arrows depict an exemplary path for an electric current from the input 151 to the output 157. It is understood that, for AC current, the electric current will also flow in the direction opposite to the arrows in FIG. 2.

Figure 4:
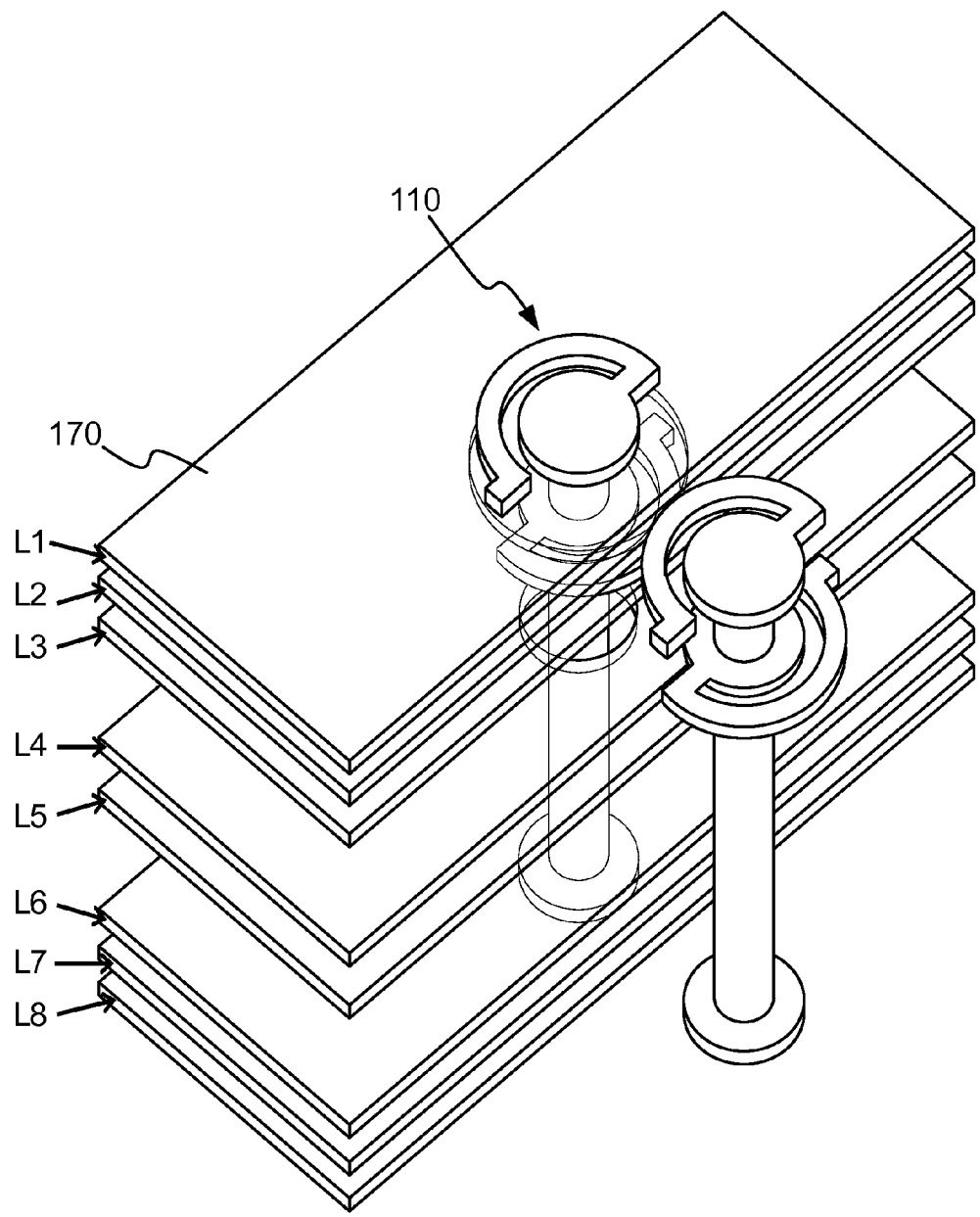
FIG. 4 is a perspective side view of a printed circuit with a pair of plated through holes and the self-coupled inductors.

In the exemplary embodiment of FIG. 2, a circuit board layer 1 to layer 3 transition is depicted, also seen in the cross-sectional view of FIG. 4. That is, in a circuit board substrate 170 (FIG. 4) that contains the plated through hole 110, a first electrical path trace is on a surface, termed "layer 1" (L1) and a second electrical path trace is on a lower interior layer, termed "layer 3" (L3). As seen in the cross-sectional view of FIG. 4, a circuit board typically has several layers (L1-L8 are shown in FIG. 4) and the via transition may take place between any two layers in the circuit board. Thus, the self-coupled inductor may be implemented for a via transition between any two layers in the circuit board. As depicted in FIGS. 2 and 4, the first inductor path 152 and the second inductor path 154 that create the self-coupled inductor may be coupled at an input 151 and an output 157 of the via portion 120 of the plated through hole 110. While a 180 degree inductor path is shown, other angles may also be used ranging from approximately 90 degrees to approximately 330 degrees. Note that the angles traversed by each inductor path may be the same or different.

Figure 3:
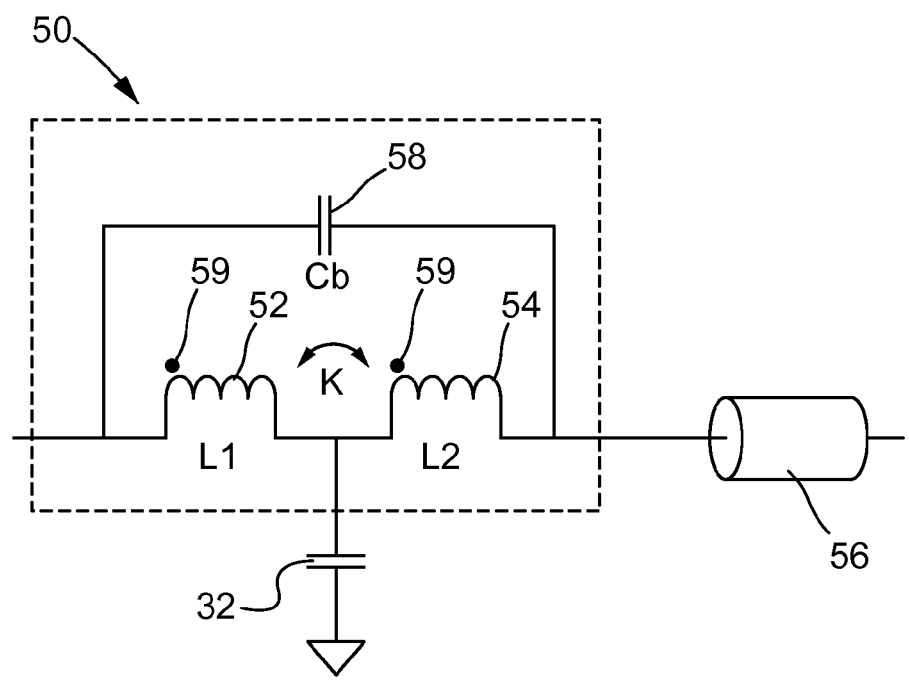
FIG. 3 is a schematic diagram of an example of a self-coupled inductor used in an embodiment.
Figure 5:
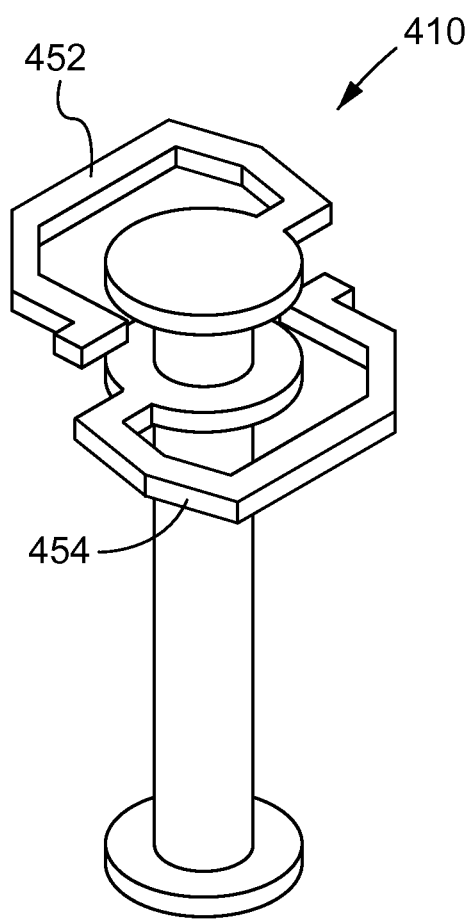
FIG. 5 is a perspective view of plated through hole with a self-coupled inductor having an approximately polygonal shape.

FIG. 3 shows an equivalent circuit diagram 50 of a self-coupled inductor including coupled inductors 52 and 54 for a plated through hole with a transmission portion (modelled by channel 56) and a stub portion (modelled by stub capacitance 32). The inductors 52 and 54 are mutually coupled as represented by k, the value of the mutual coupling coefficient. The self-coupled inductor may also create a parasitic capacitance 58 (Cb). As indicated by points 59 in the equivalent circuit diagram, the illustrated inductors 52 and 54 are configured such that electric current flows in the desired direction through each inductor. That is, the current flow in the first and second inductors should be either into or out of the center tap at the same time. The inductance values and mutual coupling may be chosen such that the transfer function will be less dependent or transparent to the stub capacitance 32 Although the paths are depicted as semicircular traces in FIGS. 2 and 4, it is understood that a wide variety of trace shapes may be employed as the inductor paths 152 and 154 depending upon the overall layout of a circuit board that includes the plated through hole 110. Such shapes may include, for example, hexagons, octagons or other higher-order polygons, square or rectangular traces, curved traces, linear trace paths, combinations of these shapes or any other shape that can accomplish the inductor function in a self-coupled inductor configuration. Exemplary polygonal-shaped traces are depicted in FIG. 5 for the inductor paths 452 and 454 of a plated through hole 410.

Figure 6:
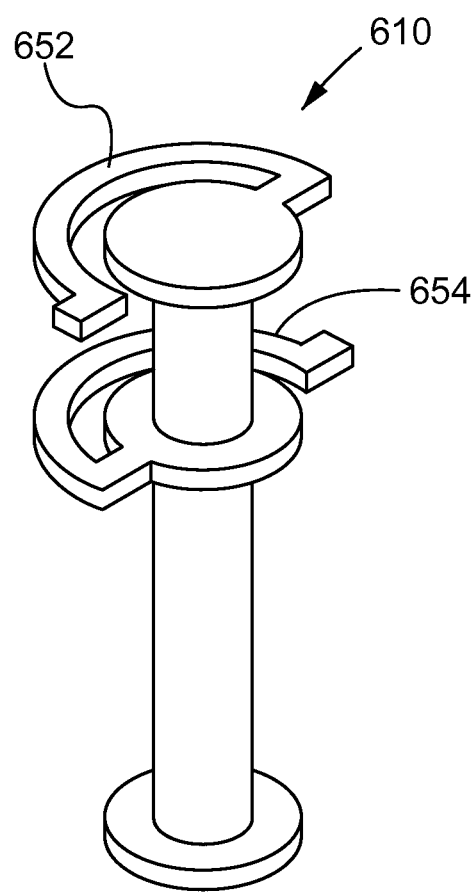
FIG. 6 is a perspective view of a plated through hole with a self-coupled inductor having inductor paths positioned on a same side of a through hole.

Although the inductor paths 152 and 154 are positioned on opposite sides of the plated through hole, each inductor path 152 and 154 can be routed on the same side of through hole and yet maintain the desired direction for electric current flow with higher mutual coupling, if needed. FIG. 6 depicts an exemplary embodiment in which an inductor path 652 is positioned on the same side of a through hole 610 as an inductor path 654.

The inductor-compensated plated through hole 110 may conform to typical design rules used in fabricating PCBs or other types of circuit boards. This fabrication may include a plated through hold drill diameter of 10 mils, a conductor cap/pad of 20 mils, a trace width of inductor paths and electrical lead lines of 4 mils with a spacing of 3.5 mils, and adjacent plated through hole spacing (pitch) of 39 mils. These parameters make the plated through hole 110 along with an adjacent plated through hole (shown in FIG. 4) feasible for differential signaling of high speed input/outputs (IOs) under a regular printed circuit board fabrication process. The values provided herein are used to facilitate discussion only and may vary depending on the circumstances.

Although the plated through hole 110 of FIG. 2 is depicted with an input at layer 1 and an output at layer 3, other layer combinations may also be used. For example, a transition between layer 1 and layer 2 may also be formed, wherein the shorter the length of the via portion 120, the longer the length of the stub portion 130. With the shorter via length may also come stronger coupling between the inductor paths 152 and 154. This stronger coupling may compensate for the stronger capacitance of the longer stub portion of the plated through hole 110. For a longer via length, for example, a transition between layer 1 and layer 5 of a circuit board, a shorter stub portion may result. This configuration may result in weaker coupling between inductor paths 152 and 154. Because the stub portion will be shorter, less compensation by the self-coupled inductor may be used due to the lower capacitance of the shorter stub portion. In this manner, the illustrated self-coupled inductor appropriately compensates for any combination of layer transitions of the plated through hole 110.

Figure 7:
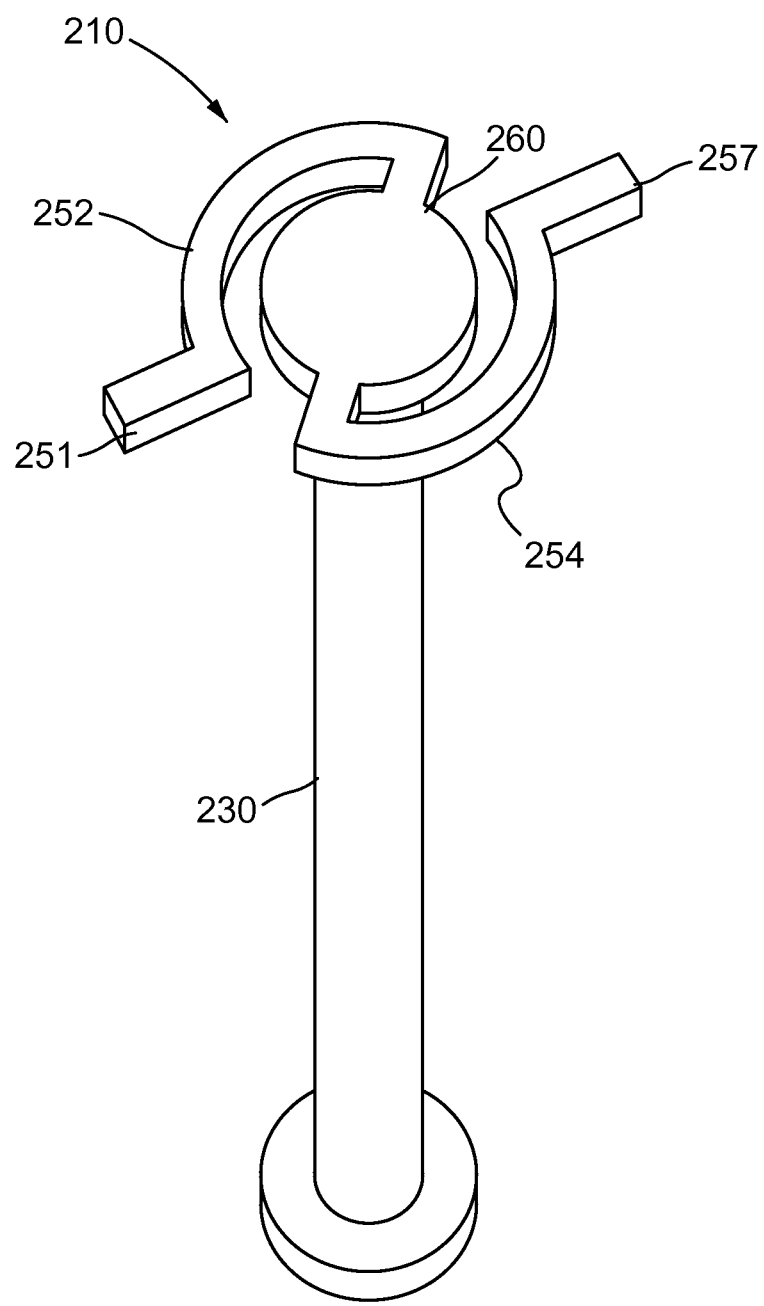
FIG. 7 is a perspective view of an example of a self-coupled inductor with input and output on the same layer according to an embodiment.

In addition to transitions between layers, the self-coupled inductor configuration may be used with plated through holes in a same-layer transition. Such a compensated plated through hole 210 is depicted in FIG. 7. As seen in FIG. 7, an inductor path 252 and an inductor path 254 may be located in the same layer (e.g., surface layer 1 in the example shown). That is, an input trace 251 and an output trace 257 may both be positioned in the same layer. Here, a cap 260 (e.g., pad) may serve as a portion of a via structure while a section 230 may be the stub portion of the plated through hole 210. In one example, the structure of FIG. 7 may be used for through hole mount structure applications.

The self-coupled inductor compensated plated through holes of the above embodiments may find application in a variety of situations such as, for example, high speed signaling (e.g., 16 GHz for PCIe (Peripheral Components Interconnect Express) signals having data rates of 25 Gbps or above for SerDes (Serializer-Deserializer) between a variety of devices on the same or other circuit boards. The plated through holes may also couple to devices not located on circuit boards. Such devices include, but are not limited to, processors, controllers, memory, switches, complex programmable logic devices, programmable logic arrays, integrated circuits, or other passive components such as capacitors, resistors, inductors, etc. A variety of applications may use the plated through holes of the present embodiments. These applications may include, for example, PCIe-4 (Peripheral Components Interconnect Express), USB (Universal Serial Bus, e.g., USB Specification 3.1, Rev. 1.0 Jul. 26, 2013), SOC (System On a Chip), Unified I/O (Input/Output), On-processor Interconnects, MIPI (Mobile and Mobile Influenced), I/O PHYs (Input Output PHYsical layer connections), MPCIe (Mini Peripheral Components Interconnect Express), and non-PSP.

Depending upon the application, the performance of the self-coupled inductor compensated plated through holes described above may be enhanced through the application of magnetic materials between the two inductors (e.g., a nickel coating in the plated through hole or addition of a high permeability material). Resistor termination of the stub portion may be added to increase high frequency performance although low frequency performance is diminished.

Figure 8:
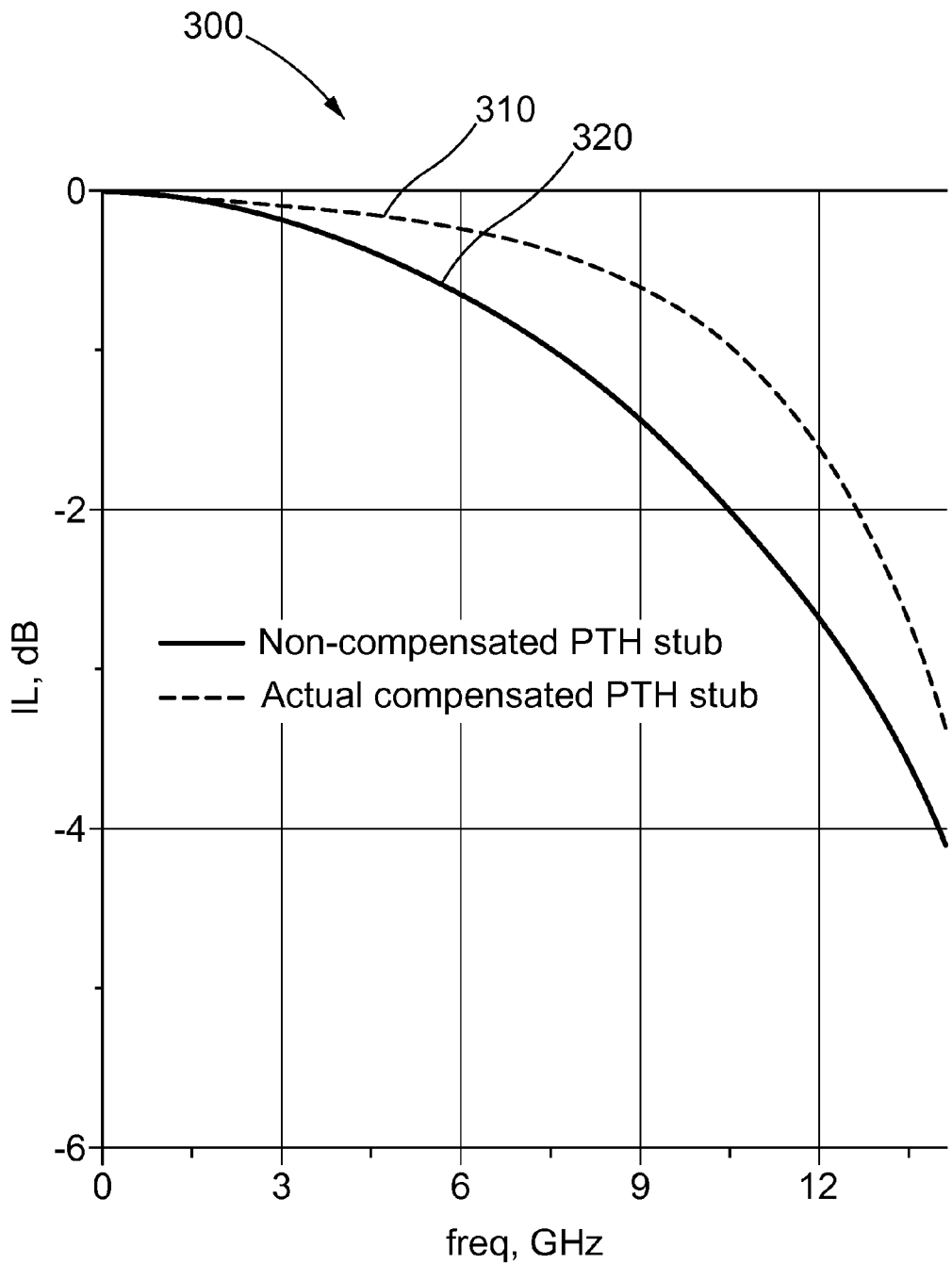
FIG. 8 is a plot of insertion loss for plated through holes without and with self-coupled inductors.

FIG. 8 depicts a plot 300 of the insertion loss for a self-coupled inductor compensated plated through hole (path 310) at a range of frequencies from DC to 15 GHz compared to an uncompensated plated through hole (path 320). In the illustrated example, the insertion loss is improved by about 1 dB over the analyzed frequency spectrum, showing that the embodiments may be advantageously employed in high speed signaling environments.

ADDITIONAL NOTES AND EXAMPLES

Advantageously, the self-coupled inductor compensated plated through holes described in the embodiments can be used in high-speed signaling environments, including data rates on the order of 30 Gbps. Such an approach may facilitate many types of interconnections, such as those between a processor and memory or a processor and a network switch. The self-coupled inductor compensated plated through holes can save the cost of circuit board fabrication as it can avoid drilling plated through holes or buried via technologies. The self-coupled inductor compensated plated holes can have flexibility on designing inductor path configurations and mutual coupling coefficients, and, thus, it can be optimized to compensate the stub capacitance. Compared to a resistor terminated approach, it is more applicable for broadband digital interconnects without compromising low frequency performance.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Example 1 may include a circuit board system including a first circuit board including a first device selected from a processor, a controller, a memory, a switch, a complex programmable logic device, a programmable logic array, or an integrated circuit; a first plated through hole having a first via portion and a first stub portion; and a first self-coupled inductor electrically coupled to the first via portion, the first self-coupled inductor including a first inductor in series with a second inductor, the first and second inductors being mutually coupled to reduce a capacitive effect of the first stub portion.

Example 2 may include the circuit board system of example 1, further comprising a second device selected from a processor, a controller, a memory, a switch, a complex programmable logic device, a programmable logic array, or an integrated circuit, the second device electrically coupled to the first circuit board.

Example 3 may include the circuit board system of example 1, wherein the first and second inductors are first and second paths connected to the first plated through hole.

Example 4 may include the circuit board system of example 3, wherein the first path is positioned at a first layer on the first circuit board and the second path is positioned at a second layer on the first circuit board.

Example 5 may include the circuit board system of example 3, wherein the first path and the second path are positioned on a same layer on the first circuit board.

Example 6 may include the circuit board system of example 1, wherein the first inductor is positioned at a first layer on the first circuit board and the second inductor is positioned at a second layer on the circuit board.

Example 7 may include the circuit board system of example 1, wherein the first and second inductors are positioned on a same layer on the first circuit board.

Example 8 may include the circuit board system of example 1, wherein the first plated through hole is capped with a conductor.

Example 9 may include the circuit board system of example 2, wherein the second device is positioned on a second circuit board.

Example 10 may include the circuit board system of example 9, wherein the second circuit board includes a second plated through hole having a second via portion and a second stub portion, the second plated through hole having a second self-coupled inductor electrically coupled to the second via portion, the second self-coupled inductor including a third inductor in series with a fourth inductor, the third and fourth inductors being mutually coupled to reduce a capacitive effect of the second stub portion.

Example 11 may include a circuit board including a plated through hole having a via portion and a stub portion; a self-coupled inductor electrically coupled to the via portion of the plated through hole, the self-coupled inductor structure including a first inductor mutually coupled to a second inductor in series to reduce a capacitive effect of the stub portion.

Example 12 may include the circuit board of example 11, wherein the first and second inductors are first and second paths connected to the plated through hole.

Example 13 may include the circuit board of example 12, wherein the first path is positioned at a first layer on the circuit board and the second path is positioned at a second layer on the first circuit board.

Example 14 may include the circuit board of example 12, wherein the first path and the second path are positioned on a same layer on the circuit board.

Example 15 may include the circuit board of example 11, wherein the first path and the second path are positioned such that electricity is to flow in the same direction in the first path and the second path.

Example 16 may include the circuit board of any one of examples 11 to 15, further comprising a device selected from a processor, a controller, a memory, a switch, a complex programmable logic device, a programmable logic array, or an integrated circuit.

Example 17 may include a method of high-speed signaling between a circuit board and a device including providing a first circuit board including a first device selected from a processor, a controller, a memory, a switch, a complex programmable logic device, a programmable logic array, or an integrated circuit; providing a first plated through hole having a first via portion and a first stub portion; providing a first self-coupled inductor electrically coupled to the first via portion, the first self-coupled inductor including a first inductor in series with a second inductor, the first and second inductors being mutually coupled to reduce a capacitive effect of the first stub portion; providing a second device selected from a processor, a controller, a memory, a switch, a complex programmable logic device, a programmable logic array, or an integrated circuit, the second device electrically coupled to the first circuit board; and sending a high speed signal between the first device and the second device.

Example 18 may include the method of example 17, wherein the first device is a processor and the second device is a memory.

Example 19 may include the method of example 17, wherein the first device is a processor and the second device is a switch.

Example 20 may include the method of example 17, wherein the high speed signal has a data rate up to 30 Gbps.

Example 21 may include the method of example 17, wherein the first and second inductors are first and second paths connected to the first plated through hole.

Example 22 may include the method of example 21, wherein the first path is positioned at a first layer on the first circuit board and the second path is positioned at a second layer on the first circuit board.

Example 23 may include the method of example 21, wherein the first and the second path are positioned on a same layer on the first circuit board.

Example 24 may include the method of example 17, wherein the first inductor is positioned at a first layer on the first circuit board and the second inductor is positioned at a second layer on the circuit board.

Example 25 may include the method of example 17, wherein the first and second inductors are positioned on a same layer on the first circuit board.

Example 26 may include the method of example 17, further providing a conductor cap on the first plated through hole.

Example 27 may include the method of any one of examples 17 to 26, further providing a second circuit board to mount the second device.

Example 28 may include the method of example 27, further providing a second plated through hole having a second via portion and a second stub portion on the second circuit board, and further providing a second self-coupled inductor electrically coupled to the second via portion of the second plated through hole, the second self-coupled inductor including a third inductor in series with a fourth inductor, the third and fourth inductors being mutually coupled to reduce a capacitive effect of the second stub portion.

Example 29 may include a circuit board including interconnect means having a via portion and a stub portion and inductor means coupled to the via portion for reducing a capacitive effect of the stub portion.

Example 30 may include the circuit board of example 29, wherein the inductor means comprises a self-coupled inductor having first inductor means and second inductor means.

Example 31 may include the circuit board of example 30, wherein the first and second inductor means each include a path coupled to the interconnect means.

Example 32 may include the circuit board of example 31, wherein the first inductor means is on a first level of the circuit board and the second inductor means is on a second level of the circuit board.

Example 33 may include the circuit board of example 31, wherein the first inductor means is on a same level of the circuit board as the second inductor means.

Example 34 may include the circuit board of example 31 further including means for providing a high speed signal.

Example 35 may include the circuit board of claim 34 further including means for receiving a high speed signal.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A circuit board comprising:
   a plated through hole having a via portion and a stub portion; and
   a self-coupled inductor electrically coupled to the via portion, the self-coupled inductor including a first inductor in series with a second inductor, the first and second inductors being mutually coupled to reduce a capacitive effect of the stub portion, wherein the first and second inductors are direct first and second approximately 180 degree paths connected to the plated through hole.

2. The circuit board of claim 1, wherein the first path is positioned at a first layer on the circuit board and the second path is positioned at a second layer on the circuit board.

3. The circuit board of claim 1, wherein the first path and the second path are positioned on a same layer on the circuit board.

4. The circuit board of claim 1, wherein the first inductor is positioned at a first layer on the circuit board and the second inductor is positioned at a second layer on the circuit board.

5. The circuit board of claim 1, wherein the first and second inductors are positioned on a same layer on the circuit board.

6. The circuit board of claim 1, wherein the plated through hole is capped with a conductor.

7. A circuit board comprising:
   a plated through hole having a via portion and a stub portion;
   a self-coupled inductor electrically coupled to the via portion of the plated through hole, the self-coupled inductor including a first inductor mutually coupled to a second inductor in series to reduce a capacitive effect of the stub portion, wherein the first and second inductors are first and second paths connected to the plated through hole, and wherein the first path is positioned at a first layer of the circuit board, and the second path is positioned at a second layer of the circuit board on substantially the same side of the through hole as the first path.

8. The circuit board of claim 7, wherein the first path and the second path are positioned such that electricity is to flow in the same direction in the first and the second path.

9. A circuit board comprising:
   interconnect means having a via portion and a stub portion; and
   self-coupled inductor means coupled to the via portion to reduce a capacitive effect of the stub portion, wherein the self-coupled inductor means comprises a first inductor means and a second inductor means in series and wherein the first inductor means and the second inductor means are first and second paths connected to the interconnect means and the first path is located at a first level of the circuit board and the second path is located at a second level of the circuit board on substantially the same side of the interconnect means as the first path.

10. The circuit board of claim 9, wherein the first inductor means is on a first level of the circuit board and the second inductor means is on a second level of the circuit board.

11. The circuit board of claim 9 further comprising means for providing a high speed signal.

12. The circuit board of claim 11 further comprising means for receiving a high speed signal.

* * * * *